(12) United States Patent
Masuoka et al.

(10) Patent No.: US 9,601,639 B2
(45) Date of Patent: Mar. 21, 2017

(54) SEMICONDUCTOR DEVICE

(71) Applicant: Mitsubishi Electric Corporation, Tokyo (JP)

(72) Inventors: Fumihito Masuoka, Tokyo (JP); Katsumi Nakamura, Tokyo (JP); Akito Nishii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/784,170

(22) PCT Filed: Jun. 12, 2013

(86) PCT No.: PCT/JP2013/066228
§ 371 (c)(1),
(2) Date: Oct. 13, 2015

(87) PCT Pub. No.: WO2014/199465
PCT Pub. Date: Dec. 18, 2014

(65) Prior Publication Data
US 2016/0056306 A1    Feb. 25, 2016

(51) Int. Cl.
*H01L 29/00* (2006.01)
*H01L 29/872* (2006.01)
(Continued)

(52) U.S. Cl.
CPC .......... *H01L 29/872* (2013.01); *H01L 29/063* (2013.01); *H01L 29/0615* (2013.01);
(Continued)

(58) Field of Classification Search
None
See application file for complete search history.

(56) References Cited

U.S. PATENT DOCUMENTS 6,384,431 B1   5/2002   Takahashi et al.
6,614,087 B1   9/2003   Morishita et al.
(Continued)

FOREIGN PATENT DOCUMENTS

JP   2001-111047 A   4/2001
JP   2001-127308 A   5/2001
(Continued)

OTHER PUBLICATIONS

Translation of the International Preliminary Report on Patentability issued in Application No. PCT/JP2013/066228, mailed Dec. 23, 2015.
(Continued)

*Primary Examiner* — William Harriston
(74) *Attorney, Agent, or Firm* — Studebaker & Brackett PC

(57) ABSTRACT

A p-type anode layer (2) is provided on an upper surface of an n-type drift layer (1). An n-type cathode layer (3) is provided on a lower surface of the $n^-$-type drift layer (1). An n-type buffer layer (4) is provided between the $n^-$-type drift layer (1) and the n-type cathode layer (3). A peak impurity concentration in the n-type buffer layer (4) is higher than that in the $n^-$-type drift layer (1) and lower than that in the n-type cathode layer (3). A gradient of carrier concentration at a connection between the $n^-$-type drift layer (1) and the n-type buffer layer (4) is 20 to 2000 $cm^{-4}$.

19 Claims, 15 Drawing Sheets

(51) Int. Cl.
    H01L 29/36      (2006.01)
    H01L 29/739     (2006.01)
    H01L 29/06      (2006.01)
    H01L 29/417     (2006.01)
    H01L 29/861     (2006.01)
    H01L 29/868     (2006.01)
    H01L 29/16      (2006.01)
    H01L 29/20      (2006.01)

(52) U.S. Cl.
    CPC ...... *H01L 29/0619* (2013.01); *H01L 29/0638* (2013.01); *H01L 29/0684* (2013.01); *H01L 29/0692* (2013.01); *H01L 29/36* (2013.01); *H01L 29/417* (2013.01); *H01L 29/7393* (2013.01); *H01L 29/7397* (2013.01); *H01L 29/8611* (2013.01); *H01L 29/1602* (2013.01); *H01L 29/1608* (2013.01); *H01L 29/2003* (2013.01); *H01L 29/861* (2013.01); *H01L 29/868* (2013.01)

(56) References Cited

U.S. PATENT DOCUMENTS

| | | | |
|---|---|---|---|
| 2007/0108558 | A1 | 5/2007 | Nemoto |
| 2010/0308446 | A1 | 12/2010 | Nakamura |
| 2015/0179441 | A1* | 6/2015 | Onozawa ............... H01L 29/36 257/109 |

FOREIGN PATENT DOCUMENTS

| | | | |
|---|---|---|---|
| JP | 2006-157057 | A | 6/2006 |
| JP | 2007-158320 | A | 6/2007 |
| JP | 2009-188177 | A | 8/2009 |
| JP | 2010-283132 | A | 12/2010 |
| JP | 2012-119716 | A | 6/2012 |

OTHER PUBLICATIONS

W. T. Read, Jr., (1958) "A Proposed High-Frequency, Negative-ResistanceDiode," The Bell System Technical Journal, pp. 401-446.

H. Egawa, (1966) "Avalanche Characteristics and Failure Mechanism of High Voltage Diodes," IEEE Trans. Electron Devices, vol. ED-13, No. 11, pp. 754-758.

R. Siemieniec et al., (2004) "Analysis of Plasma Extraction Transit Time Oscillations in Bipolar Power Devices," Proc ISPSD '04, pp. 249-252.

K. Satoh et al., (2000) "A Newly Structured High Voltage Diode Highlighting Oscillation Free Function in Recovery Process," Proc. ISPSD '2000, pp. 249-252.

M. T. Rahimo et al., (1997) "Optimization of the Reverse Recovery Behavior of Fast Power Diodes Using Injection Efficiency and Lifetime Control Techniques," Proc. EPE '97, pp. 2099-2104.

M. Nemoto et al., (2004) "MBBL Diode: A Novel Soft Recovery Diode," Proc. ISPSD '04, pp. 433-436.

H. Fujii et al., (2009) "A Novel Buffer Structure and Lifetime Control Technique with Poly-Si for Thin Wafer Diode," Proc. ISPSD '09, pp. 140-143.

A. Kopta et al., (2005) "The Field Charge Extraction (FCE) Diode A Novel Technology for Soft Recovery High Voltage Diodes," Proc. ISPSD '05, pp. 83-86.

H. P. Felsl et al., (2008) "The CIBH Diode—Great Improvement for Ruggedness and Softness of High Voltage Diodes," Proc. ISPSD '08, pp. 173-176.

K. Nakamura et al., (2006) The Second Stage of a Thin Wafer IGBT Low Loss 1200V LPT-CSTBT™ with a Backside Doping Optimization Process, Proc. ISPSD '06, pp. 133-136.

K. Nakamura et al., (2009) "Evaluation of Oscillatory Phenomena in Reverse Operation for High Voltage Diodes," Proc. ISPSD '09, pp. 156-159.

K. Nakamura et al., (2010) "Advanced RFC Technology with New Cathode Structure of Field Limiting Rings for High Voltage Planar Diode," Proc. ISPSD '10, pp. 133-136.

A. Nishii et al., (2011) "Relaxation of Current Filament due to RFC Technology and Ballast Resistor for Robust FWD Operation," Proc. ISPSD '11, pp. 96-99.

F. Masuoka et al., (2012) "Great Impact of RFC Technology on Fast Recovery Diode towards 600 V for Low Loss and High Dynamic Ruggedness," Proc. ISPSD '12, pp. 373-376.

International Search Report issued in Application No. PCT/JP2013/066228, mailed Sep. 10, 2013.

* cited by examiner

SEMICONDUCTOR DEVICE

TECHNICAL FIELD

The present invention relates to a semiconductor device such as a diode for use in a high-withstand-voltage power module 600 V).

BACKGROUND ART

Since the dawn of semiconductor technology in 1950s, various studies have been conducted on a radiofrequency oscillation phenomenon (see, for example, Non-Patent Literature 1) and a breakdown phenomenon (see, for example, Non-Patent Literature 2) in a Si-based p-i-n diode. These phenomena in power devices made operable at an increasingly higher speed lead to malfunctions of peripheral circuits and surge breakdown of the devices. In recent years, these phenomena have again attracted attention (see, for example, Non-Patent Literature 3).

It is known that in a high-speed recovery diode these phenomena are noticeable under hard recovery conditions, such as a high Vcc, a high wiring inductance (Ls), a low operating temperature and a low current density (JA) (see, for example, Non-Patent Literatures 5, and 11). Solutions to the above-described problem with high-speed recovery diodes have been attained by enabling "soft recovery", e.g., by adopting a thick $n^-$-type drift layer or a thick n-type buffer layer and by applying a lifetime control technique (see, for example, Non-Patent Literatures 5 to 7). These methods, however, entail trade-offs among EMI (Electromagnetic Compatibility) noise, the breakdown tolerance and the total loss, and it is difficult to ensure a high level of compatibility among them.

On the other hand, the main characteristics of diodes have been remarkably improved by means of diodes having a $p^+$-type layer in their back surfaces (see, for example, Non-Patent Literatures 4, 8, and 9), including RFC diodes (see, for example, Non-Patent Literatures 10 to 14). As further development problems, however, a challenge to extend the operating temperature range at the high-temperature side by reducing a leak current, a challenge to improve the maximum breaking current density by reducing VF (a voltage drop when the diode is turned on) in a high current density region, a challenge to improve the avalanche tolerance by strengthening the buffer structure are left.

A diode having an n-type buffer layer provided between an $n^-$-type drift layer and an n-type cathode layer and having a medium impurity concentration between those of the $n^-$-type drift layer and the n-type cathode layer has been proposed (see, for example, Patent Literatures 1 and 2). While no concrete numeric value of the concentration gradient in the n-type buffer layer is described in Patent Literature 1, a concentration gradient of $8\times10^3$ $cm^{-4}$ can be estimated from FIG. 3 in Patent Literature 1. The n-type buffer layer in Patent Literature 2 is of the construction described in Non-Patent Literature 10 and the concentration gradient therein is $1\times10^5$ $cm^{-4}$.

CITATION LIST

Patent Literature

Patent Literature 1: Japanese Patent Laid-Open No. 2007-158320

Patent Literature 2: Japanese Patent Laid-Open No. 2010-283132

Non-Patent Literature

Non-Patent Literature 1: W. T. READ, JR, "A Proposed High-Frequency, Negative-Resistance Diode," The Bell system technical journal, pp. 401-446 (March 1958)

Non-Patent Literature 2: H. Egawa, "Avalanche Characteristics and Failure Mechanism of High Voltage Diodes," IEEE Trans. Electron Devices, vol. ED-13, No. 11, pp. 754-758 (1966)

Non-Patent Literature 3: R. Siemieniec, P. Mourick, J. Lutz, M. Netzel, "Analysis of Plasma Extraction Transit Time Oscillations in Bipolar Power Devices," Proc. ISPSD'04, pp. 249-252, Kitakyushu, Japan (2004)

Non-Patent Literature 4: K. Satoh, K. Morishita, Y. Yamaguchi, N. Hirano, H. Iwamoto and A. Kawakami, "A Newly Structured High Voltage Diode Highlighting Oscillation Free Function in Recovery Process," Proc. ISPSD'2000, pp. 249-252, Toulouse, France (2000)

Non-Patent Literature 5: M. T. Rahimo and N. Y. A. Shammas, "Optimization of the Reverse Recovery Behavior of Fast Power Diodes Using Injection Efficiency And Lifetime Control Techniques," Proc. EPE'97, pp. 2.099-2.104, Trondheim, Norway (1997)

Non-Patent Literature 6: M. Nemoto, T. Naito, A. Nishihara, K. Ueno, "MBBL diode: a novel soft recovery diode," Proc. ISPSD'04, pp. 433-436, Kitakyushu, Japan Non-Patent Literature 7: H. Fujii, M. Inoue, K. Hatade and Y. Tomomatsu, "A Novel Buffer Structure and lifetime control Technique with Poly-Si for Thin Wafer Diode," Proc. ISPSD'09, pp. 140-143, Barcelona, Spain (2009)

Non-Patent Literature 8: A. Kopta and M. Rahimo, "The Field Charge Extraction (FCE) Diode A Novel Technology for Soft Recovery High Voltage Diodes," Proc. ISPSD'05, pp. 83-86, Santa Barbara, Calif., USA (2005)

Non-Patent Literature 9: H. P. Felsl, M. Pfaffenlehner, H. Schulze, J. Biermann, Th. Gutt, H.-J. Schulze, M. Chen and J. Luts, "The CIBH Diode—Great Improvement for Ruggedness and Softness of High Voltage Diodes," Proc. ISPSD'08, pp. 173-176, Orlando, Fla., USA (2008)

Non-Patent Literature 10: K. Nakamura, Y. Hisamoto, T. Matsumura, T. Minato and J. Moritani, "The Second Stage of a Thin Wafer IGBT Low Loss 1200V LPT-CSTBT™ with a Backside Doping Optimization Process," Proc. ISPSD'06, pp. 133-136, Naples, Italy (2006)

Non-Patent Literature 11: K. Nakamura, H. Iwanaga, H. Okabe, S. Saito and K. Hatade, "Evaluation of Oscillatory Phenomena in Reverse Operation for High Voltage Diodes," Proc. ISPSD'09, pp. 156-159, Barcelona, Spain (2009)

Non-Patent Literature 12: K. Nakamura, F. Masuoka, A. Nishii, K. Sadamatsu, S. Kitajima and K. Hatade, "Advanced RFC Technology with New Cathode Structure of Field Limiting Rings for High Voltage Planar Diode," Proc. ISPSD'10, pp. 133-136, Hiroshima, Japan (2010)

Non-Patent Literature 13: A. Nishii, K. Nakamura, F. Masuoka and T. Terashima, "Relaxation of Current Filament due to RFC Technology and Ballast Resistor for Robust FWD Operation," Proc. ISPSD'11, pp. 96-99, San Diego, Calif., USA (2011)

Non-Patent Literature 14: F. Masuoka, K. Nakamura, A. Nishii and T. Terashima, "Great Impact of RFC Technology on Fast Recovery Diode towards 600 V for Low Loss and High Dynamic Ruggedness," Proc. ISPSD'12, pp. 373-376, Bruges, Belgium (2012)

SUMMARY OF INVENTION

Technical Problem

In the conventional semiconductor devices, the gradient of the carrier concentration in the connection between the n$^-$-type drift layer and the n-type buffer layer is as steep as $8\times10^3$ cm$^{-4}$ or $8\times10^5$ cm$^{-1}$ and, therefore, snap-off occurs with increase in intensity of the electric field at the connection. Further, there is a problem that radiofrequency oscillation occurs with snap-off acting as a trigger.

VF-recovery loss EREC trade-off characteristics of conventional diodes have been adjusted by a lifetime control method using heavy metal diffusion or irradiation with electrons or ions. Variations in VF and EREC, however, are increased depending, for example, on the angle of irradiation and the temperature of the member to be irradiated at the time of irradiation with electrons or ions. Also, lattice defects are changed by self-heating during chip energization operation, thereby causing variations in electrical characteristics. Further, thermal runaway occurs during high-temperature operation because of a large leak current due to lattice defects. Therefore, there has been a demand for establishing a method of controlling a VF-EREC trade-off characteristic without depending on the lifetime control method.

Power devices have been put to various uses and a demand has arisen for avalanche tolerance of IGBTs, diodes, etc. A semiconductor device having a parasitic bipolar transistor structure, however, has reduced avalanche tolerance in comparison with semiconductor devices having no such structure. If the thickness of the n$^-$-type drift layer is reduced with the aim of improving a VF-EREC characteristic, then the avalanche tolerance is considerably reduced. Also, a semiconductor device having a parasitic bipolar transistor structure has a reduced maximum controllable current density in comparison with semiconductor devices having no such structure.

The present invention has been achieved to solve the above-described problems, and a first object of the present invention is to obtain a semiconductor device capable of achieving high oscillation tolerance. A second object of the present invention is to obtain a semiconductor device capable of increasing the avalanche tolerance and the maximum controllable current density by improving a VF-EREC trade-off characteristic without depending on the lifetime control method.

Means for Solving the Problems

A semiconductor device according to the present invention includes: an n-type drift layer; a p-type anode layer provided on an upper surface of the n-type drift layer; a cathode layer provided on a lower surface of the n-type drift layer; and an n-type buffer layer provided between the n-type drift layer and the cathode layer, wherein a peak impurity concentration in the n-type buffer layer is higher than that in the n-type drift layer and lower than that in the cathode layer, and a gradient of carrier concentration at a connection between the n-type drift layer and the n-type buffer layer is 20 to 2000 cm$^{-4}$.

Advantageous Effects of Invention

The present invention makes it possible to achieve high oscillation tolerance.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
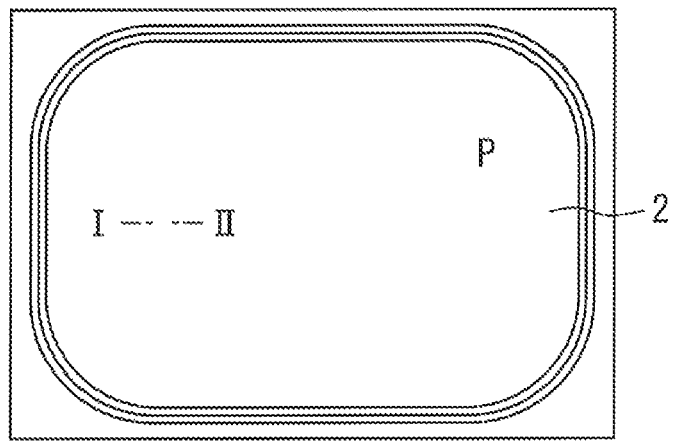
FIGS. 1 and 2 are a top view and a bottom view, respectively, of a semiconductor device according to Embodiment 1 of the present invention.
Figure 2:
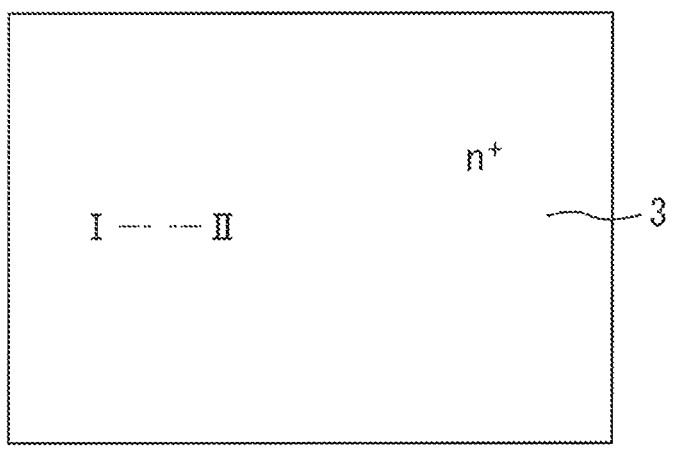
Figure 3:
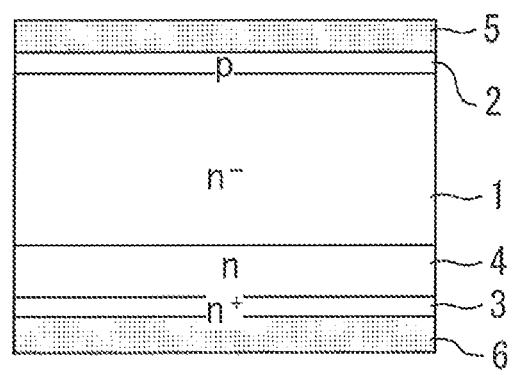
FIG. 3 is a sectional view taken along line I-II in FIGS. 1 and 2.

FIGS. 1 and 2 are a top view and a bottom view, respectively, of a semiconductor device according to Embodiment 1 of the present invention. FIG. 3 is a sectional view taken along line I-II in FIGS. 1 and 2. A p-type anode layer 2 is provided on an upper surface of an n⁻-type drift layer 1. An n-type cathode layer 3 is provided on a lower surface of the n⁻-type drift layer 1.

An n-type buffer layer 4 is provided between the n⁻-type drift layer 1 and the n-type cathode layer 3. The peak impurity concentration in the n-type buffer layer 4 is higher than that in the n⁻-type drift layer 1 and lower than that in the n-type cathode layer 3. An anode electrode 5 is in ohmic contact with the p-type anode layer 2, while a cathode electrode 6 is in ohmic contact with the n-type cathode layer 3.

Figure 4:
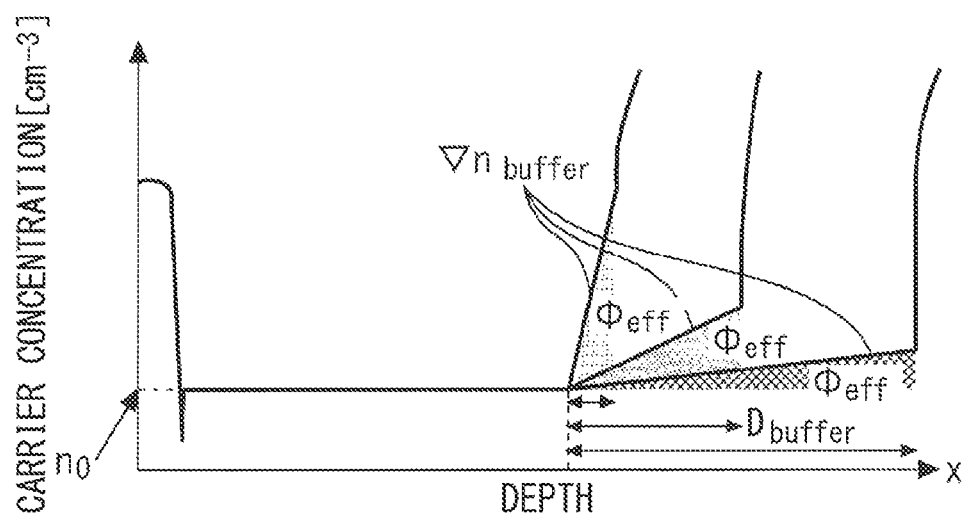
FIG. 4 is a diagram showing carrier concentration with respect to depth.

FIG. 4 is a diagram showing carrier concentration with respect to depth. The depth of the n-type buffer layer 4 is denoted by $D_{buffer}$; the gradient of carrier concentration at the connection between the n-type drift layer and the n-type buffer layer, concentration gradient $\nabla n_{buffer}$ [cm⁻⁴]; an effective dose in the n-type buffer layer 4, $\phi_{eff}$ [cm⁻²]; and the carrier concentration in the n⁻-type drift layer 1, $n_0$ [cm⁻³]. The relationship among these is expressed by the following equation:

$$\phi_{eff} = \int_0^{D_{buffer}} n_0 \exp(\nabla n_{buffer} \cdot x) dx \approx 1 \times 10^{12} \sim 5 \cdot 10^{12} \text{ (cm}^{-2}) \text{ [Expression 1]}$$

Figure 5:
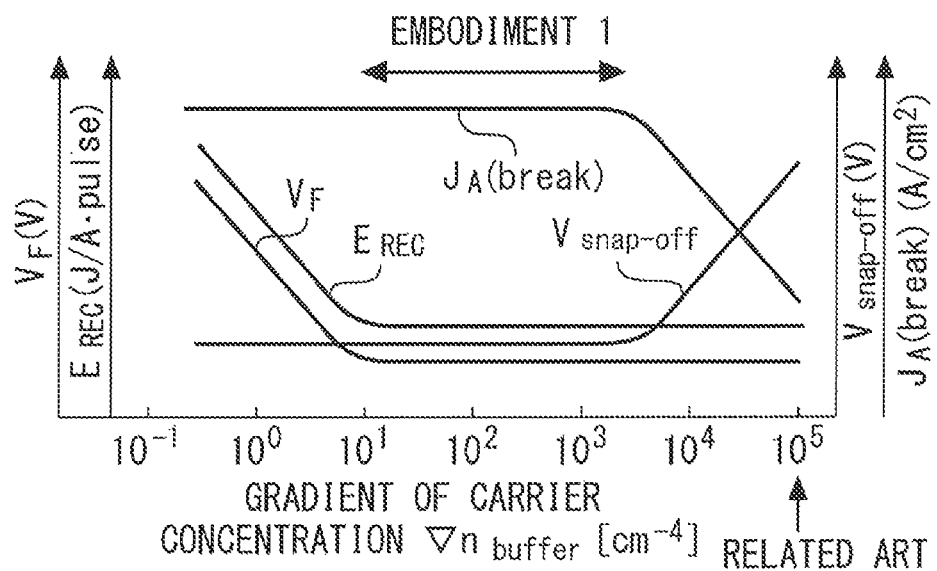
FIG. 5 is a diagram showing $V_F$, $E_{REC}$, $V_{snap-off}$ and $J_{A(break)}$ with respect to the gradient $\nabla n_{buffer}$ of the carrier concentration.

FIG. 5 is a diagram showing $V_F$, $E_{REC}$, $V_{snap-off}$ and $J_{A(break)}$ with respect to the gradient $\nabla n_{buffer}$ of the carrier concentration. $V_F$ is a voltage drop in the on state; $E_{REC}$, a recovery loss; $V_{snap-off}$, an overshoot voltage at the time of recovery; and $J_{A(break)}$, the maximum controllable current density. The concentration gradient $\nabla n_{buffer}$ is set to 20 to 2000 cm⁻⁴ on the basis of this data in order that $V_F$, $E_{REC}$ and $V_{snap-off}$ be increased and $J_{A(break)}$ be increased. In the related art, the concentration gradient is about 10⁵ cm⁻⁴ and is steeper than that in the present embodiment.

A deep buffer structure in which the carrier concentration at the connection between the n⁻-type drift layer 1 and the n-type buffer layer 4 is distributed gradually and broadly as in the present embodiment is called a CPL (Controlling Plasma Layer) buffer structure. This CPL buffer structure enables limiting of a rise in electric field strength at this boundary at the time of recovery. As a result, snap-off caused by the rise in electric field strength on the cathode side and radiofrequency oscillation triggered by the snap-off can be prevented, thus achieving high oscillation tolerance.

Also, the effective dose $\phi_{eff}$ in the n-type buffer layer 4 is set to $1 \times 10^{12}$ to $5 \times 10^{12}$ cm⁻² higher than that in the n⁻-type drift layer 1. The total dose in the n-type buffer layer 4 is thereby made substantially equal to the total dose in the n⁻-type drift layer 1, so that the withstand voltage can be maintained with each of the n⁻-type drift layer 1 and the n-type buffer layer 4. As a result, in comparison with the case where the n-type buffer layer 4 does not exist, the thickness of the n⁻-type drift layer 1 necessary for maintaining the same withstand voltage can be reduced and the total loss can be reduced.

The carrier concentration $n_0$ in the n⁻-type drift layer 1 is determined depending on the withstand voltage class. For example, in the case of a 600 to 6500 V class, the carrier concentration $n_0$ is $1 \times 10^{12}$ to $1 \times 10^{15}$ cm⁻³. The surface concentration in the n-type cathode layer 3 is $1 \times 10^{19}$ to $5 \times 10^{20}$ cm⁻ and the diffusion depth in the n-type cathode layer 3 is 0.5 to 2 μm. The thickness $D_{buffer}$ of the n-type buffer layer 4 is a function of $n_0$, $\nabla n_{buffer}$ and $\phi_{eff}$ as shown by the expression above.

The ratio of the peak impurity concentration in the n-type buffer layer 4 and the peak impurity concentration in the n⁻-type drift layer 1 is $1 \times 10^{-4}$ to $5 \times 10^{-1}$. The ratio of the depths of the n-type buffer layer 4 and the n⁻-type drift layer 1 is 0.1 to 10.

Embodiment 2

Figure 6:
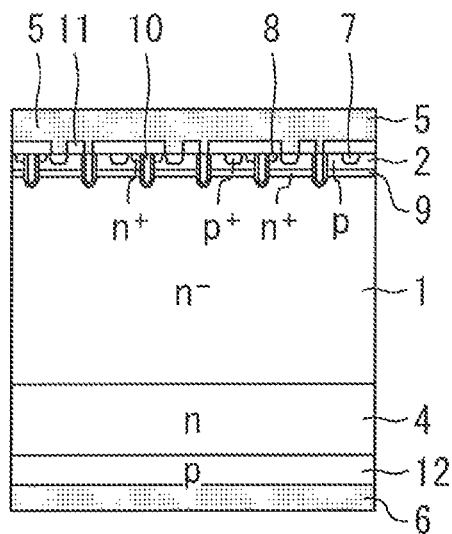
FIG. 6 is a sectional view of a semiconductor device according to Embodiment 2 of the present invention.

FIG. 6 is a sectional view of a semiconductor device according to Embodiment 2 of the present invention. While Embodiment 1 is a diode, the present embodiment is an IGBT (Insulated Gate Bipolar Transistor).

The p-type anode layer 2 is a p-type base layer and the peak impurity concentration therein is $1.0 \times 10^{16}$ to $1.0 \times 10^{18}$ cm⁻³. A p⁺-type diffusion layer 7 and n⁺-type emitter layer 8 are partially formed in a wafer surface portion on the p-type anode layer 2. The peak impurity concentration in the n⁺-type emitter layer 8 is $1.0 \times 10^{18}$ to $1.0 \times 10^{21}$ cm⁻³ and the depth of the n⁺-type emitter layer 8 is 0.2 to 1.0 μm.

An n⁺-type layer 9 is formed between the p-type anode layer 2 and the n⁻-type drift layer 1. The peak impurity concentration in the n⁺-type layer 9 is $1.0 \times 10^{15}$ to $1.0 \times 10^{17}$ cm⁻³. The n⁺-type layer 9 is deeper by 0.5 to 1.0 μm than the p-type anode layer 2.

A trench gate 10 is provided so as to extend through the n⁺-type emitter layer 8, the p-type anode layer 2 and the n⁺-type layer 9. An interlayer insulating film 11 is provided on the trench gate 10. The anode electrode 5 is an emitter electrode connected to the p⁺-type diffusion layer 7. A p-type collector layer 12 is provided in place of the n-type cathode layer 3. The cathode electrode 6 is a collector electrode in ohmic contact with the p-type collector layer 12.

The peak impurity concentration in the n-type buffer layer 4 is higher than that in the n⁻-type drift layer 1 and lower than that in the p-type collector layer 12. The gradient of carrier concentration at the connection between the n⁻-type drift layer 1 and the n-type buffer layer 4 is set to 20 to 2000 cm⁻⁴, as in Embodiment 1. Also, the effective dose $\phi_{eff}$ in the n-type buffer layer 4 is set to $1.0 \times 10^{12}$ to $5 \times 10^{12}$ cm⁻² higher than the effective dose in the n⁻-type drift layer 1. The same effects as those of Embodiment 1 can thus be obtained even in the case of the IGBT.

Embodiment 3

Figure 7:
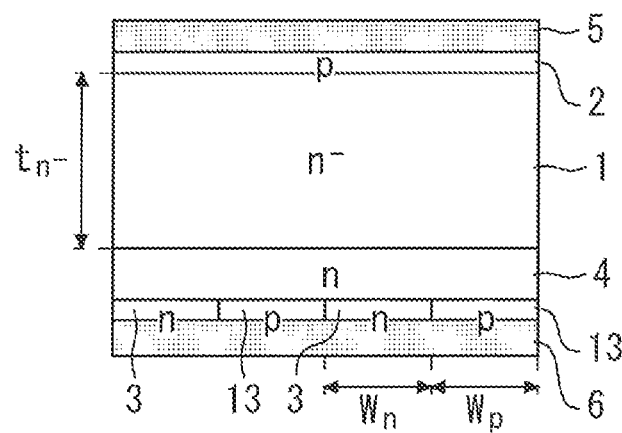
FIG. 7 is a sectional view of a semiconductor device according to Embodiment 3 of the present invention.

FIG. 7 is a sectional view of a semiconductor device according to Embodiment 3 of the present invention. The n-type cathode layer 3 and a p-type cathode layer 13 are alternately disposed by being arranged side by side in place of the single n-type cathode layer 3 in Embodiment 1. The cathode electrode 6 is in ohmic contact with the n-type cathode layer 3 and the p-type cathode layer 13. Therefore, the p-type cathode layer 13 is short-circuited to the n-type cathode layer 3 through the cathode electrode 6. The peak impurity concentration in the n-type cathode layer 3 is higher than that in the p-type cathode layer 13.

The relationship shown below is established among the depth tn⁻ of the n⁻-type drift layer 1, the width Wn of the n-type cathode layer 3, and the width Wp of the p-type cathode layer 13. 2tn⁻≥(Wn+Wp)≥tn⁻/10.

Figure 8:
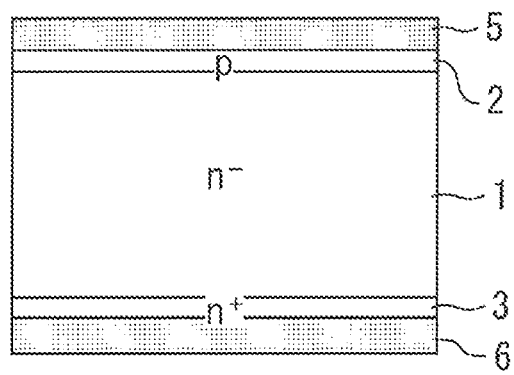
FIG. 8 is a sectional view of the semiconductor device according to the comparative example.

The effects of the present embodiment will be described in comparison with a comparative example. More specifically, dependence of the peak impurity concentration and the diffusion depth in the n-type buffer layer 4 on Vrrm, snap-off tolerance and recovery tolerance in the present embodiment designed to have a withstand voltage of 1700 V and a diode in the comparative example will be described. FIG. 8 is a sectional view of the semiconductor device according to the comparative example. In the comparative example, the n-type buffer layer 4 does not exist and the n-type cathode layer 3 is a single layer.

The degree of tolerance of a recovery condition with respect to the peak voltage $V_{snap\text{-}off}$ in FIG. 4 of Non-Patent Literature 14 is referred to as snap-off tolerance. If the snap-off tolerance is higher, the operation under hard recovery conditions of, for example, a higher applied voltage, a lower current, a lower temperature and a faster current breaking can be permitted. Also, a safe operation region formed by the applied voltage Vcc and the maximum breaking current density $J_{A(break)}$ shown in FIG. 7 of Non-Patent Literature 14 is referred to as recovery tolerance. If the recovery tolerance is higher, the recovery operation under conditions of a higher applied voltage and a higher current density can be permitted.

Figure 9:
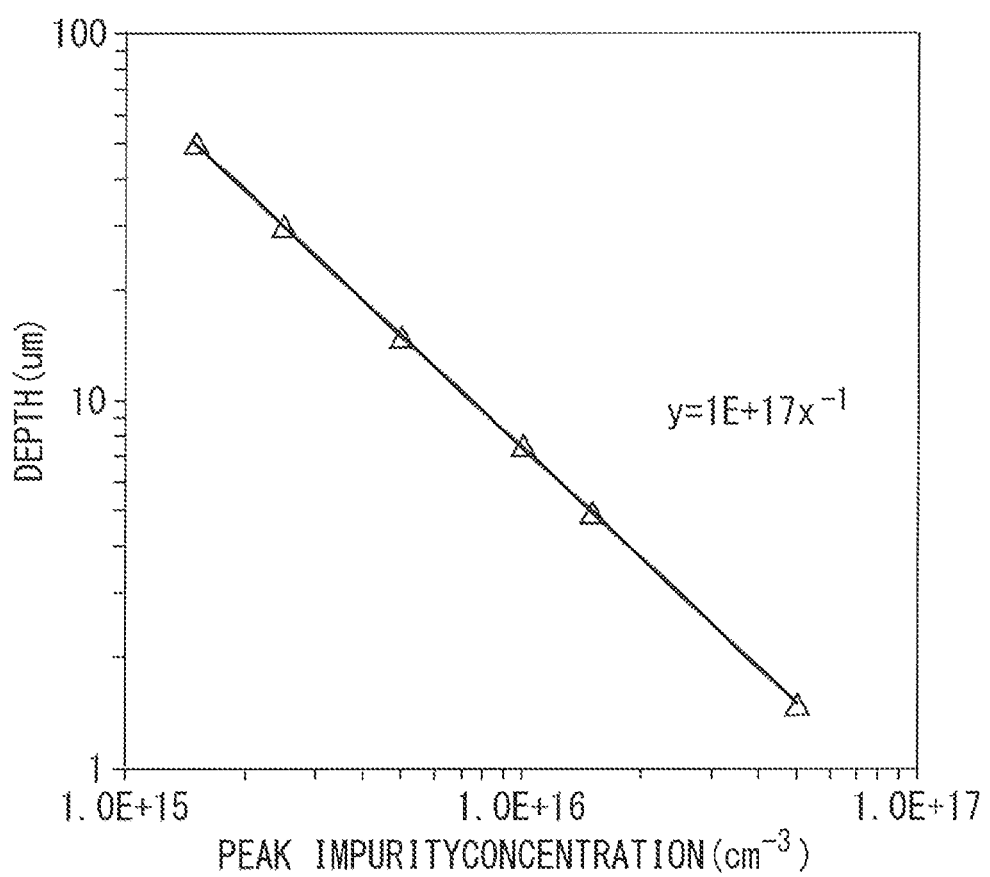
FIG. 9 is a diagram showing the peak impurity concentration and diffusion depth in an n-type buffer layer used for a simulation.

FIG. 9 is a diagram showing the peak impurity concentration and diffusion depth in an n-type buffer layer used for a simulation. As shown in the diagram, the n-type buffer layer 4 close to a Gaussian distribution was simulated by fixing the dose at $3.75 \times 10^{12}$ cm$^{-2}$ and setting a peak impurity concentration and a diffusion depth set by triangular simulation. The thickness of the n$^-$-type drift layer 1 was set constant regardless of the thickness of the n-type buffer layer 4.

Figure 10:
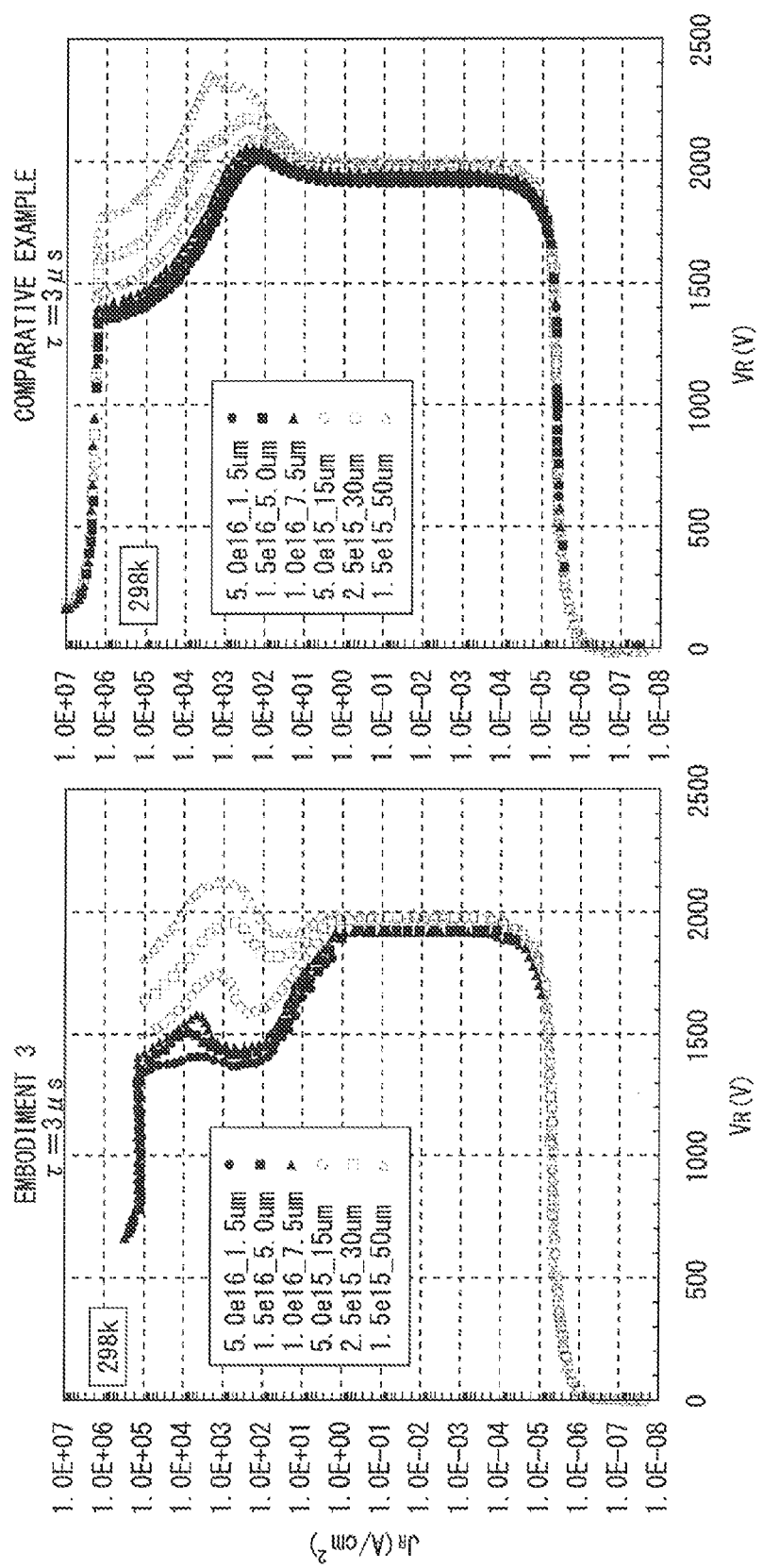
FIG. 10 is a diagram showing the results of simulation of the dependence of the withstand voltage waveform on the buffer layer thickness in the comparative example and Embodiment 3.
Figure 11:
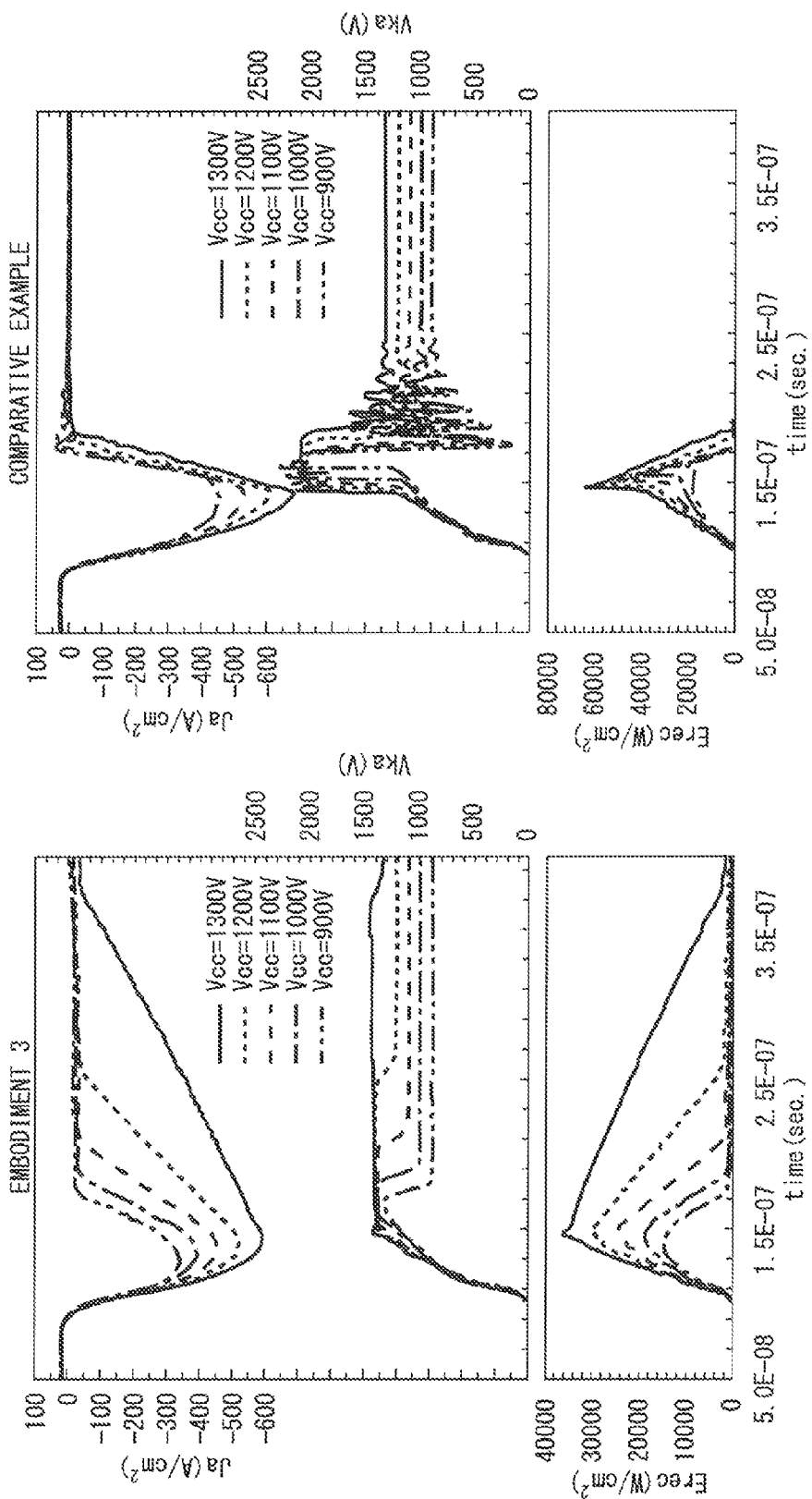
FIGS. 11 and 12 are diagrams showing the results of simulation of the Vcc dependence of the snappy recovery waveform in the comparative example and Embodiment 3.
Figure 12:
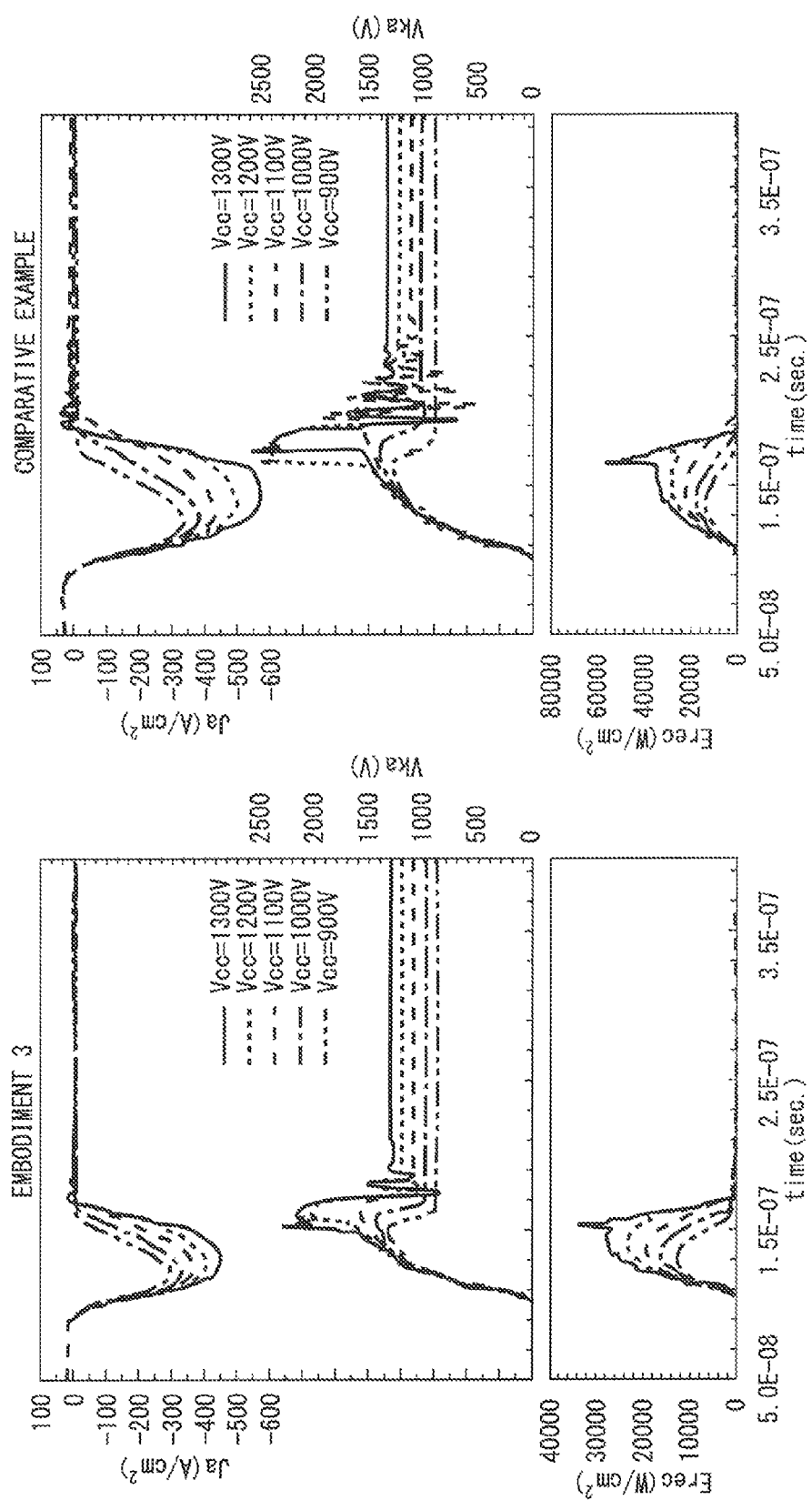

FIG. 10 is a diagram showing the results of simulation of the dependence of the withstand voltage waveform on the buffer layer thickness in the comparative example and Embodiment 3. Each diode was designed so as to have a withstand voltage of 1700 V. FIGS. 11 and 12 are diagrams showing the results of simulation of the Vcc dependence of the snappy recovery waveform in the comparative example and Embodiment 3. The peak impurity concentration in the n-type buffer layer 4 is $5 \times 10^{16}$ cm$^{-3}$ and the thickness of the n-type buffer layer 4 is 1.5 µm for the results shown in FIG. 11 and 50 µm for the results shown in FIG. 12.

In the comparative example, electrons generated by impact ionization due to a rise in electric field strength at the main junction run to the cathode side under the high electric field in the n$^-$-type drift layer 1. The concentration of electrons is thereby made higher than the carrier density in the buffer layer, so that the gradient of the electric field in the n-type buffer layer 4 is reversed according to the Poisson's equation and the electric field strength is increased at the cathode side as well as at the main junction. In the comparative example, therefore, a characteristic of a negative differential resistance NDR appears more noticeably from about JR=10 A/cm$^2$ if the thickness of the n-type buffer layer 4 is increased. At about JR=100 to 1000 A/cm$^2$, impact ionization is caused both at the main junction and at the cathode side and electrons and positive holes are supplied from the main junction side and the cathode side into the n$^-$-type drift layer 1, resulting in secondary breakdown.

On the other hand, in the present embodiment, secondary breakdown appears at about JR=1 A/cm$^2$ in the withstand voltage waveform when no NDR characteristic appears in the withstand voltage waveform, and when the thickness of the n-type buffer layer 4 is small. Secondary breakdown in this small current region leads to a reduction in maximum breaking current density and a reduction in avalanche tolerance in recovery SOA of the diode. There is, therefore, a demand for increasing the current at the point of occurrence of secondary breakdown. In a diode structure having a tendency to exhibit an NDR characteristic, a voltage surge and snap-off occur with a rise of the electric field at the cathode side at the time of recovery, and radiofrequency oscillation can occur easily by being triggered thereby (see FIGS. 11 and 12). There is, therefore, a need to bring the withstand voltage waveform of the diode closer to a straight line, such that an S-shaped curve due to an NDR characteristic and secondary breakdown is not exhibited. From a read from FIG. 10, it cans be said that making the n-type buffer layer 4 thicker is preferred.

However, if the n-type buffer layer 4 is simply made thicker while the thickness of the n$^-$-type drift layer 1 is fixed, the resistance component in the on state is increased, resulting in an increase (deterioration) in VF. In the present embodiment, therefore, the gradient of carrier concentration at the connection between the n$^-$-type drift layer 1 and the n-type buffer layer 4 is set to 20 to 2000 cm$^{-4}$. Making the change in concentration at the connection gradual as described above enables limiting of the rise in electric field strength at the connection at the time of recovery while secondary breakdown and NDR in the withstand voltage waveform are prevented and the increase in VF is limited. As a result, snap-off caused by the rise in electric field strength at the cathode side and radiofrequency oscillation that occurs by being triggered thereby can be prevented, thus achieving high oscillation tolerance.

The width expressed by (Wn+Wp) is referred to as an RFC cell pitch. If the RFC cell pitch is made small, VF is increased and EREC is reduced. That is, the VF-EREC trade-off curve is shifted to the high speed side. In a case where the present embodiment is applied to a freewheel diode to be incorporated in an inverter, therefore, the VF-EREC trade-off characteristic can be adjusted by adjusting the RFC cell pitch according to use. However, if the RFC cell pitch is set excessively small, the snap-off tolerance is reduced. Conversely, if the RFC pitch is set excessively large, the recovery tolerance is reduced.

The ratio expressed by (Wp/(Wn+Wp)) is referred to as an RFC cell short rate. If the RFC cell short rate is reduced, VF is increased and EREC is reduced. That is, the VF-EREC trade-off curve is shifted to the high speed side. In a case where the present embodiment is applied to a freewheel diode to be incorporated in an inverter, therefore, the VF-EREC trade-off characteristic can be adjusted by adjusting the RFC cell short rate according to use. However, if the RFC cell short rate is set excessively small, the snap-off tolerance is reduced and the cross point is increased. Conversely, if the RFC pitch is set excessively large, the recovery tolerance is reduced.

Thus, in the present embodiment, the VF-EREC trade-off characteristic can be controlled by adjusting the RFC cell pitch or the RFC cell short rate without depending on the lifetime control method.

When the dose in the p-type cathode layer 13 is reduced, the snap-off tolerance is reduced. However, EREC and a leak current can be limited thereby. When the dose in the p-type cathode layer 13 is increased, the reverse result is obtained. With respect to this, in the present embodiment, the snap-off tolerance and the recovery tolerance can be secured and the setting permissible range of the dose in the p-type cathode layer 13 can be extended.

In a simple p-n junction, the temperature dependence of VF is basically positive and a current can flow more easily when the temperature is increased. When non-uniformity occurs in temperature distribution of power chips connected in parallel with each other in a large-capacity power module, positive feedback may occur such that the current flowing through one of the chips generating a larger amount of heat is further increased to generate heat, and there is a possibility of breakdown of the module caused thereby. It is, therefore, desirable that the current value (cross point) at which a room temperature VF curve and a high-temperature VF curve intersect each other be lower. In the present embodiment, the efficiency of carrier injection from the anode and cathode can be reduced by reducing the effective doses in the anode and cathode. The cross point at a lower current value can therefore be achieved.

The arrangement may alternatively be such that the cathode electrode 6 is in ohmic contact with the n-type cathode layer 3 and in Schottky contact with the p-type cathode layer 13. Because the Schottky barrier difference between the cathode electrode 6 and the p-type cathode layer 13 is large, a state similar to that in a case where a resistance component is added to the parasitic pnp transistor is attained, thereby enabling limiting of the current in the device vertical direction produced by the operation of the parasitic pnp transistor. As a result, high recovery SOA and high avalanche tolerance can be achieved.

Embodiment 4

Figure 13:
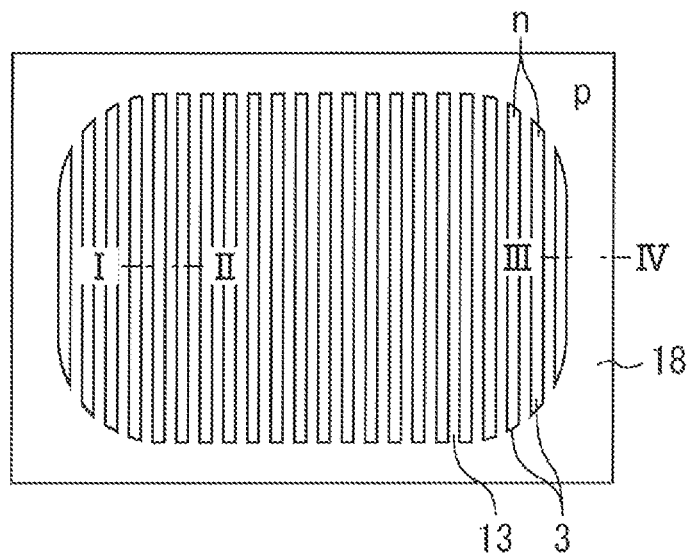
FIG. 13 is a back surface view of a semiconductor device according to Embodiment 4 of the present invention.
Figure 14:
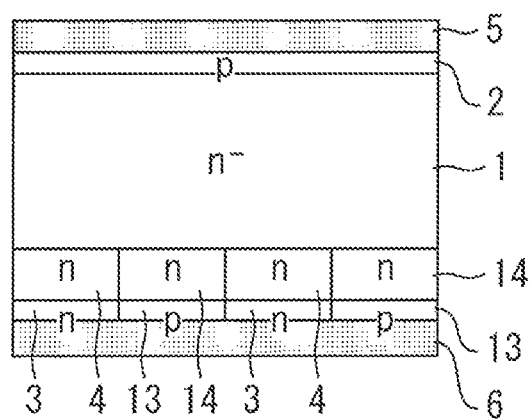
FIG. 14 is a sectional view taken along line I-II in FIG. 13.

FIG. 13 is a back surface view of a semiconductor device according to Embodiment 4 of the present invention. FIG. 14 is a sectional view taken along line I-II in FIG. 13. The n-type buffer layer 4 and an n-type buffer layer 14 are alternately disposed by being arranged side by side in place of the single n-type buffer layer 4 in Embodiment 3. The n-type buffer layer 4 is provided between the n$^-$-type drift layer 1 and the n-type cathode layer 3, while the n-type buffer layer 14 is provided between the n$^-$-type drift layer 1 and the p-type cathode layer 13. The peak impurity concentrations in the n-type buffer layers 4 and 14 are higher than that in the n$^-$-type drift layer 1 and lower than that in the n-type cathode layer 3. The peak impurity concentration in the n-type buffer layer 4 is higher than that in the n-type buffer layer 14. In other respects, the construction is the same as that in Embodiment 3.

Figure 15:
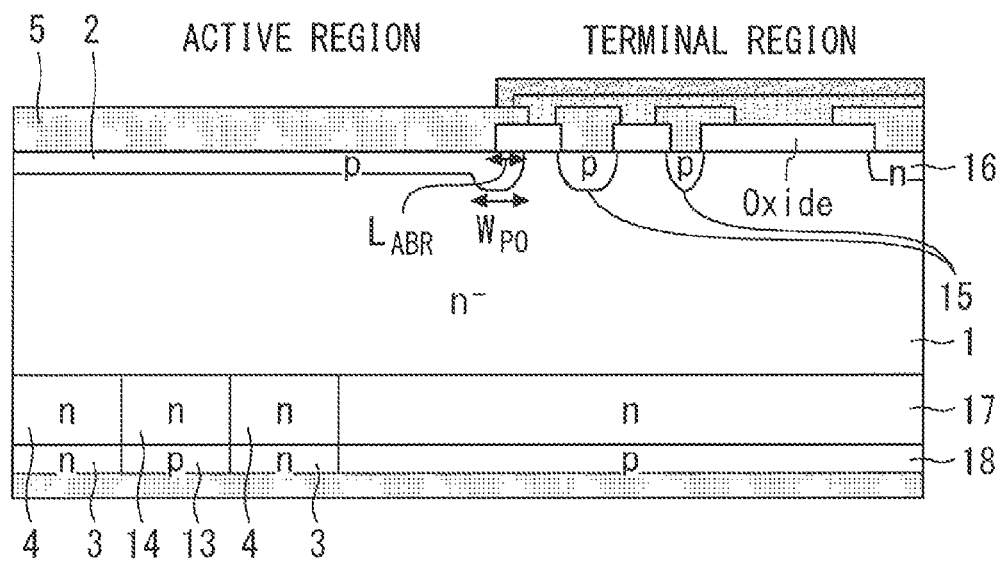
FIG. 15 is a sectional view taken along line in FIG. 13.

FIG. 15 is a sectional view taken along line III-IV in FIG. 13. A region where the p-type anode layer 2 is provided is an active region. A region outside the active region is a terminal region. An ordinary p-type guard ring layer 15 is provided in the terminal region at an anode side, and an n-type channel stopper layer 16 is provided in an outermost peripheral portion of the terminal region. The peak impurity concentration in the p-type guard ring layer 15 is higher than that in the p-type anode layer 2. The peak impurity concentration in the n-type channel stopper layer 16 is higher than that in the n$^-$-type drift layer 1.

A cathode structure in the terminal region extends from a position at a distance WGR: 10 to 500 µm on the active region side from an outermost peripheral portion of the p-type anode layer 2. The cathode structure in the terminal region is of a two-layer structure formed of an n-type layer 17 and a p-type layer 18.

In the present embodiment, the efficiency of injection of electrons from the cathode side in the on state is improved by increasing the dose in the n-type buffer layer 4 on the n-type cathode layer 3. When electromotive force induced in an L load circuit is applied to cause the device to enter an avalanche state, it is difficult for the depletion layer to reach the p-type cathode layer 13, and NDR (secondary breakdown) in the withstand voltage waveform is inhibited. As a result, low VF and high avalanche tolerance can be achieved. The degree of tolerance of an avalanche state is referred to as avalanche tolerance.

The n-type cathode layer 3 and the p-type cathode layer 13 are a stripe pattern. A pattern in which an assumed ratio of the n-type cathode layer 3 and the p-type cathode layer 13 is reflected can therefore be designed easily.

Figure 16:
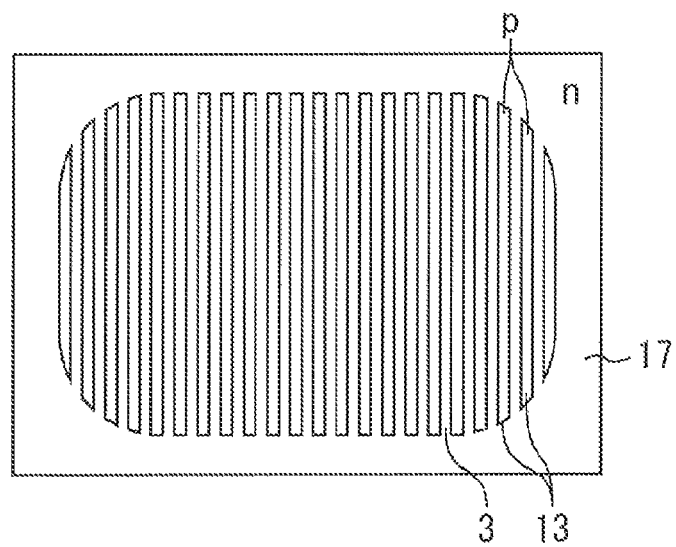
FIG. 16 is a bottom view of Modified Example 1 of the semiconductor device according to Embodiment 4 of the present invention.

FIG. 16 is a bottom view of Modified Example 1 of the semiconductor device according to Embodiment 4 of the present invention. Even in a case where the cathode of in the terminal region is of the n-type as in this example, the same effects as those described above can also be obtained.

Figure 17:
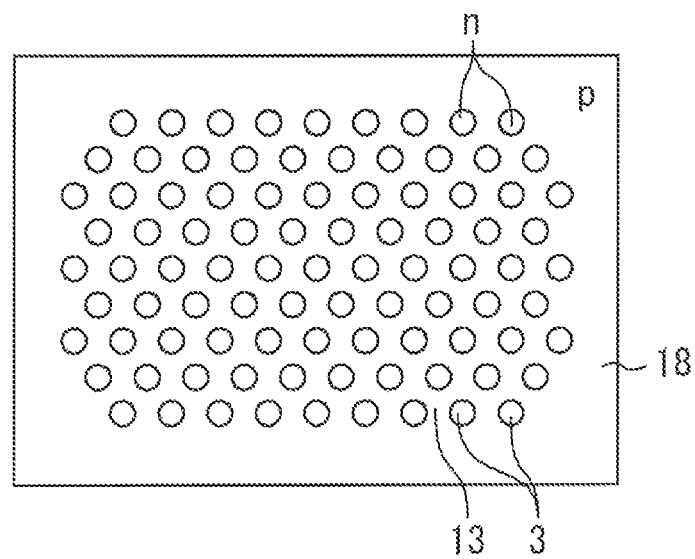
FIG. 17 is a bottom view of Modified Example 2 of the semiconductor device according to Embodiment 4 of the present invention.

FIG. 17 is a bottom view of Modified Example 2 of the semiconductor device according to Embodiment 4 of the present invention. The n-type cathode layer 3 is a dot pattern. Pattern design in which consideration is also given to corner portions is enabled thereby to realize uniform device operation. As a result, high recovery SOA can be achieved. Even in the case where the p-type cathode layer 13 is a dot pattern, the same effects can also be obtained.

Embodiment 5

Figure 18:
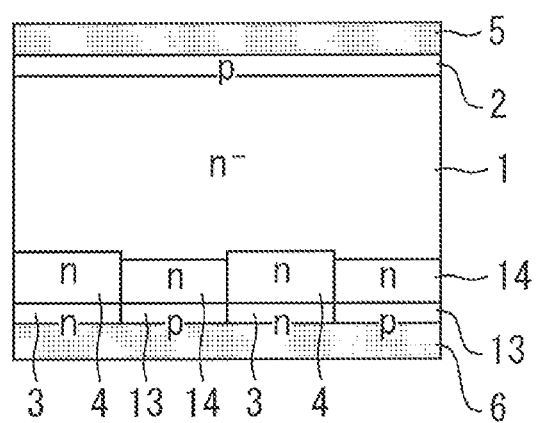
FIG. 18 is a sectional view of a semiconductor device according to Embodiment 5 of the present invention.

FIG. 18 is a sectional view of a semiconductor device according to Embodiment 5 of the present invention. The depth of the n-type buffer layer 4 is larger than that of the n-type buffer layer 14. In other respects, the construction is the same as that in Embodiment 4. Also in this case, the same effects as those of Embodiment 4 can be obtained.

Embodiment 6

Figure 19:
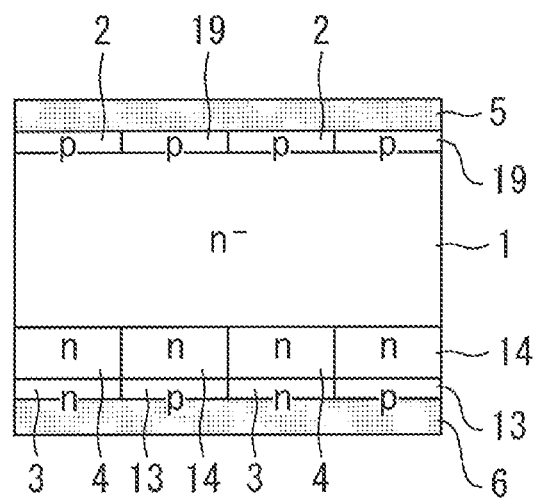
FIG. 19 is a sectional view of a semiconductor device according to Embodiment 6 of the present invention.

FIG. 19 is a sectional view of a semiconductor device according to Embodiment 6 of the present invention. The p-type anode layer 2 and a p-type anode layer 19 are alternately disposed by being arranged side by side in place of the single p-type anode layer 2 in Embodiment 4. The anode electrode 5 is in ohmic contact with the p-type anode layers 2 and 19. Therefore, the p-type anode layer 19 is short-circuited to the p-type anode layer 2 through the anode electrode 5. The peak impurity concentration in the p-type anode layer 19 is lower than that in the p-type anode layer 2. The ratio of the peak impurity concentration of the p-type anode layer 2 to that of the p-type anode layer 19 is 0.5 to 500.

As a result of the provision of the low-concentration p-type anode layer 19, the efficiency of injection at the anode side in the on state is limited and the carrier concentration at the anode side in the on state is therefore reduced, thereby enabling limiting of a rise in electric field strength at the cathode side acting as an oscillation trigger. Also, the carrier in the n$^-$-type drift layer 1 is reduced in the on state. A phenomenon in which the carrier is concentrated at the boundary between the terminal region and the active region at the time of recovery to cause breakdown can therefore be inhibited. As a result, high recovery SOA, high oscillation tolerance, low VF, a low cross point and high surge current tolerance can be achieved.

Embodiment 7

Figure 20:
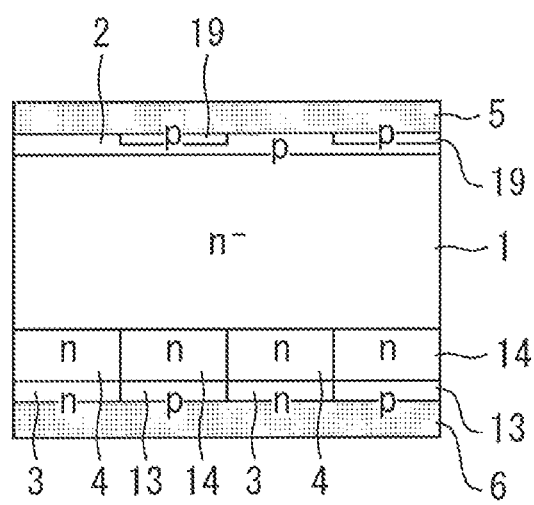
FIG. 20 is a sectional view of a semiconductor device according to Embodiment 7 of the present invention.

FIG. 20 is a sectional view of a semiconductor device according to Embodiment 7 of the present invention. The p-type anode layer 19 is provided only in part of the upper surface of the p-type anode layer 2. The ratio of the depth of the p-type anode layer 19 to the depth of the p-type anode layer 2 is 0.1 to 0.9. Also in this case, the same effects as those of Embodiment 6 can be obtained.

Embodiment 8

Figure 21:
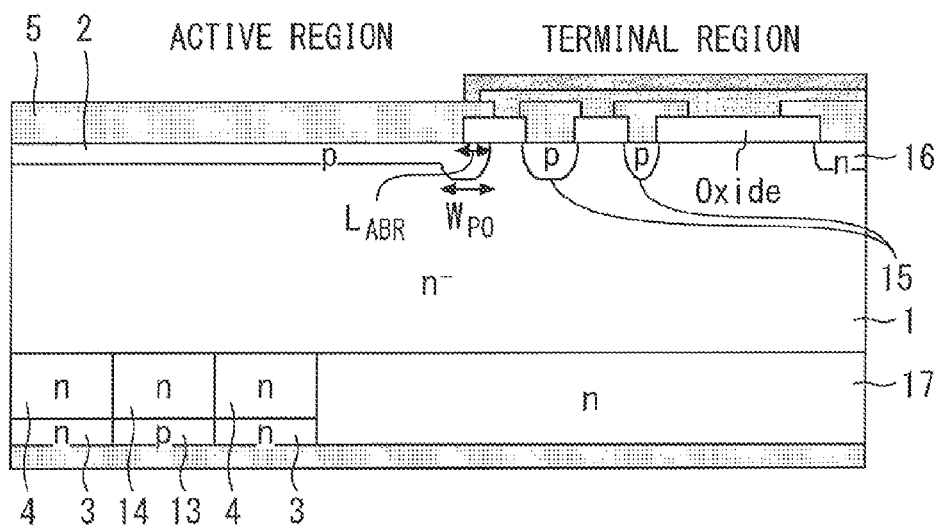
FIG. 21 is a sectional view of a semiconductor device according to Embodiment 8 of the present invention.

FIG. 21 is a sectional view of a semiconductor device according to Embodiment 8 of the present invention. Only the single n-type layer 17 is provided on the lower surface of the n⁻-type drift layer 1 in the terminal region. The cathode electrode 6 is electrically connected by being brought into contact with the n-type layer 17. The n-type layer 17 has a peak impurity concentration of $1 \times 10^{15}$ to $1 \times 10^{16}$ cm$^{-3}$. The contact resistance of the n-type buffer layer 14 to the cathode electrode 6 is thereby increased. Injection of electrons from the cathode side of the terminal region in the on state can therefore be limited to improve recovery SOA.

Embodiment 9

Figure 22:
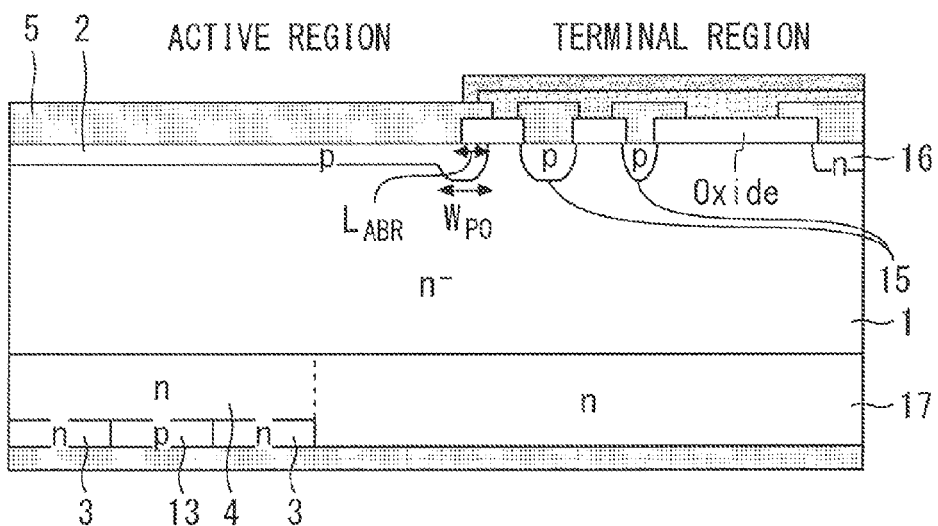
FIG. 22 is a sectional view of a semiconductor device according to Embodiment 9 of the present invention.

FIG. 22 is a sectional view of a semiconductor device according to Embodiment 9 of the present invention. The n-type buffer layer 4 in single layer form. The n-type layer 17 in the cathode structure in the terminal region is also in single layer form. Thus, the construction can be further simplified from that in Embodiment 8.

Embodiment 10

Figure 23:
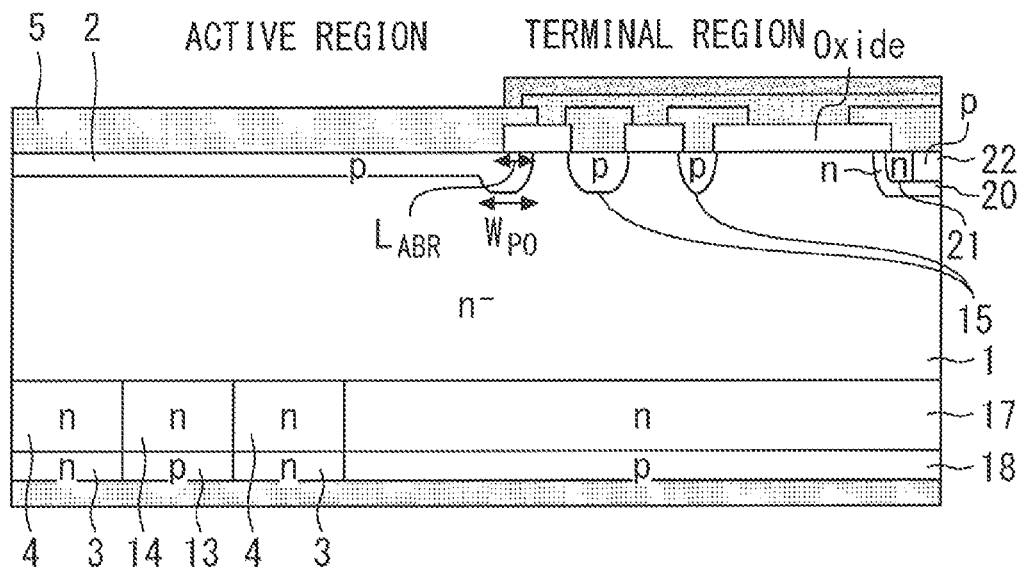
FIG. 23 is a sectional view of a semiconductor device according to Embodiment 10 of the present invention.

FIG. 23 is a sectional view of a semiconductor device according to Embodiment 10 of the present invention. An n-type channel stopper buffer layer 20 is provided in an outermost peripheral portion of the terminal region. An n-type channel stopper layer 21 and a p-type channel stopper layer 22 are provided in the n-type channel stopper buffer layer 20. The peak impurity concentration in the n-type channel stopper buffer layer 20 is higher than that in the n⁻-type drift layer 1. The peak impurity concentration in the n-type channel stopper layer 21 is higher than that in the n-type channel stopper buffer layer 20 and that in the p-type channel stopper layer 22. High recovery SOA can thereby be achieved.

Embodiment 11

Figure 24:
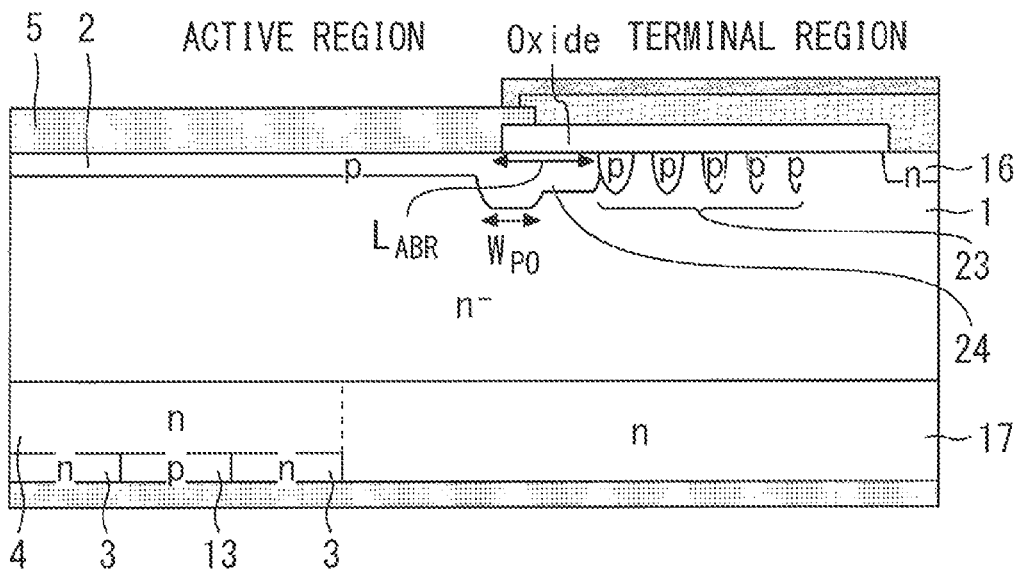
FIG. 24 is a sectional view of a semiconductor device according to Embodiment 11 of the present invention.

FIG. 24 is a sectional view of a semiconductor device according to Embodiment 11 of the present invention. An LNFLR (Linearly-Narrowed Field Limiting Ring) structure 23 is provided in place of the ordinary p-type guard ring layer 15. The LNFLR structure 23 is a plurality of p-type layers periodically arranged in parallel from the active region toward the terminal region. The plurality of p-type layers have a linear concentration gradient toward the terminal region.

A RESURF (Reduced Surface Field) structure 24 is provided between the p-type anode layer 2 in the active region and the LNFLR structure 23. The RESURF structure 24 has a deep p layer formed at the end of the active region and a p layer of the same diffusion depth as that of the diffusion layer in the LNFLR structure 23. The dose in the RESURF structure 24 is $2 \times 10^{12}$/m$^2$ and the width of the RESURF structure 24 is 5 to 100 μm. The steepness of the electric field peak at the time of recovery can be reduced by providing the RESURF structure 24.

Embodiment 12

Figure 25:
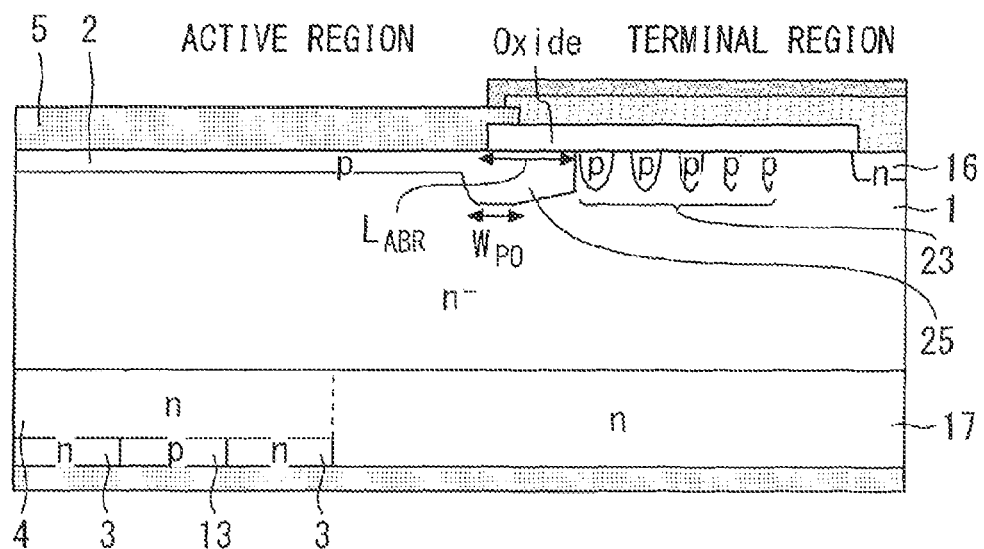
FIG. 25 is a sectional view of a semiconductor device according to Embodiment 12 of the present invention.

FIG. 25 is a sectional view of a semiconductor device according to Embodiment 12 of the present invention. In the present embodiment, a VLD (variation of Lateral Doping) structure 25 is provided in place of the RESURF structure 24 of Embodiment 11. The VLD structure 25 has a deep p layer formed at the end of the active region and a p layer with a gradient for connection between the depth of the deep p layer and the depth of the LNFLR diffusion layer.

Embodiment 13

Figure 26:
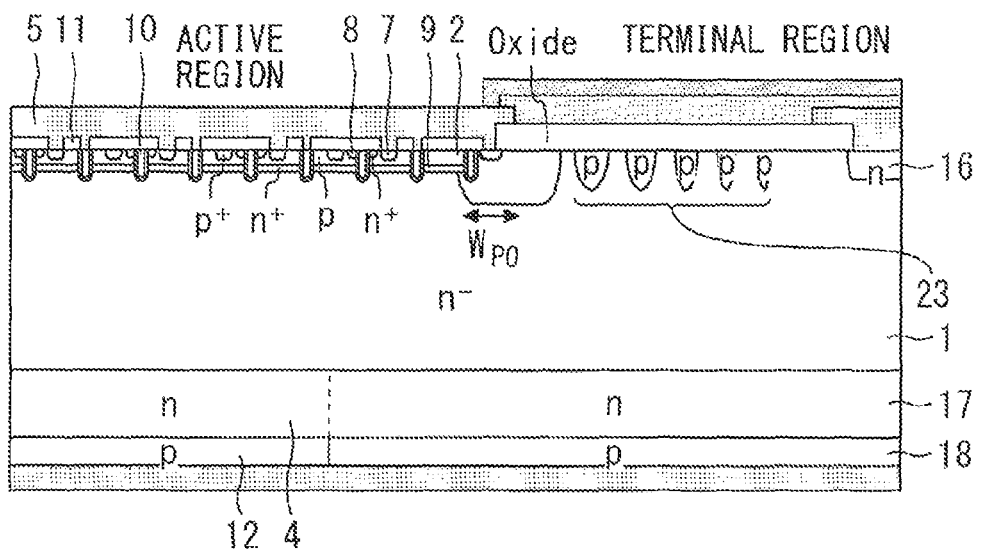
FIG. 26 is a sectional view of a semiconductor device according to Embodiment 13 of the present invention.

FIG. 26 is a sectional view of a semiconductor device according to Embodiment 13 of the present invention. An IGBT is provided in the active region, while the LNFLR structure 23 is provided in the terminal region. Also in this case, the same effects as those of Embodiment 11 can be obtained.

The semiconductor device in the present application is not limited to those formed of silicon. The semiconductor device in the present application may also be a device formed of a wide-bandgap semiconductor having a bandgap larger than that of silicon. The wide-bandgap semiconductor is, for example, silicon carbide, a gallium nitride-based material or diamond. A semiconductor device formed of such a wide-bandgap semiconductor has a high withstand voltage characteristic and allowable current density and can therefore be miniaturized. This miniaturized device may be used to enable the semiconductor module incorporating this device to be miniaturized. Since the heat resistance of the element is high, the heat dissipating fins of the heat sink can be reduced in size and a water cooling part can be replaced with an air cooling part. The semiconductor module can therefore be further reduced in size. Also, the power loss in the element is low and the efficiency of the element is high. The semiconductor module can therefore be improved in efficiency.

While devices in a low or middle class such as the 1200 V or 1700 V class have been described by way of example in the descriptions of the embodiments, the above-described effects can be obtained no matter what the withstand voltage class.

DESCRIPTION OF SYMBOLS

The following is a description of symbols used herein: 1 n⁻-type drift layer; 2,19 p-type anode layer; 3 n-type cathode layer; 4,14 n-type buffer layer; 6 cathode electrode; 12 p-type collector layer; 13 p-type cathode layer; 17 n-type layer; 20 n-type channel stopper buffer layer; 21 n-type channel stopper layer; 22 p-type channel stopper layer; 23 LNFLR structure; 24 RESURF structure; and 25 VLD structure.

The invention claimed is:
1. A semiconductor device comprising:
an n-type drift layer;
a p-type anode layer provided on an upper surface of the n-type drift layer;
a cathode layer provided on a lower surface of the n-type drift layer; and
an n-type buffer layer provided between the n-type drift layer and the cathode layer,
wherein a peak impurity concentration in the n-type buffer layer is higher than that in the n-type drift layer and lower than that in the cathode layer, and
a gradient of carrier concentration at a connection between the n-type drift layer and the n-type buffer layer is 20 to 2000 cm$^{-4}$.

2. The semiconductor device of claim 1, wherein effective dose in the n-type buffer layer is $1\times10^{12}$ to $5\times10^{12}$ cm$^{-2}$ higher than that in the n-type drift layer.

3. The semiconductor device of claim 1, wherein the cathode layer is of n-type.

4. The semiconductor device of claim 1, wherein the cathode layer is of p-type.

5. The semiconductor device of claim 1, wherein the cathode layer includes an n-type cathode layer and a p-type cathode layer which are arranged side by side.

6. The semiconductor device of claim 5, wherein the n-type buffer layer includes a first n-type buffer layer provided between the n-type drift layer and the n-type cathode layer, and a second n-type buffer layer provided between the n-type drift layer and the p-type cathode layer, and
a peak impurity concentration in the first n-type buffer layer is higher than that in the second n-type buffer layer.

7. The semiconductor device of claim 5, further comprising a cathode electrode which is in ohmic contact with the n-type cathode layer and in Schottky contact with the p-type cathode layer.

8. The semiconductor device of claim 5, wherein the n-type cathode layer and the p-type cathode layer are a stripe pattern.

9. The semiconductor device of claim 5, wherein the n-type cathode layer or the p-type cathode layer is a dot pattern.

10. The semiconductor device of claim 1, wherein the p-type anode layer includes a first p-type anode layer, and a second p-type anode layer having a peak impurity concentration lower than that in the first p-type anode layer, and
a ratio of a peak impurity concentration in the first p-type anode layer and that in the second p-type anode layer is 0.5 to 500.

11. The semiconductor device of claim 10, wherein a ratio of a depth of the second p-type anode layer to a depth of the first p-type anode layer is 0.1 to 0.9.

12. The semiconductor device of claim 1, comprising:
an n-type layer provided on a lower surface of the n-type drift layer in a terminal region and having a peak impurity concentration of $1.0\times10^{15}$ to $1.0\times10^{16}$ cm$^{-3}$; and
a cathode electrode electrically connected by being brought into contact with the cathode layer and the n-type layer.

13. The semiconductor device of claim 1, comprising:
an n-type channel stopper buffer layer provided in an outermost peripheral portion of a terminal region; and
an n-type channel stopper layer and a p-type channel stopper layer provided in the n-type channel stopper buffer layer,
wherein a peak impurity concentration in the n-type channel stopper buffer layer is higher than that in the n-type drift layer, and
a peak impurity concentration in the n-type channel stopper layer is higher than that in the n-type channel stopper buffer layer and that in the p-type channel stopper layer.

14. The semiconductor device of claim 1, further comprising:
an LNFLR (Linearly-Narrowed Field Limiting Ring) structure provided in a terminal region; and
a RESURF (Reduced Surface Field) structure provided in an outer end part of the p-type anode layer.

15. The semiconductor device of claim 1, further comprising:
an LNFLR structure provided in a terminal region; and
a VLD (Variation of Lateral Doping) structure provided in an outer end part of the p-type anode layer.

16. A semiconductor device comprising:
an n-type drift layer;
a p-type anode layer provided on an upper surface of the n-type drift layer;
a cathode layer provided on a lower surface of the n-type drift layer; and
an n-type buffer layer provided between the n-type drift layer and the cathode layer,
wherein a peak impurity concentration in the n-type buffer layer is higher than that in the n-type drift layer and lower than that in the cathode layer,
a carrier concentration at a connection between the n-type drift layer and the n-type buffer layer increases in an exponential function of depth from the n-type drift layer side to the cathode layer side, and
a gradient of the carrier concentration in the n-type buffer layer at a connection between the n-type drift layer and the n-type buffer layer is 20 to 2000 cm$^{-4}$.

17. A semiconductor device comprising:
an n-type drift layer;
a p-type base layer provided on an upper surface of the n-type drift layer;
an n-type emitter layer partially provided on the p-type base layer;
a trench gate provided so as to extend through the n-type emitter layer and the p-type base layer;
a p-type collector layer provided on a lower surface of the n-type drift layer; and
an n-type buffer layer provided between the n-type drift layer and the p-type collector layer,
wherein a peak impurity concentration in the n-type buffer layer is higher than that in the n-type drift layer and lower than that in the p-type collector layer,
a carrier concentration in the n-type buffer layer increases in an exponential function of depth from the n-type drift layer side to the p-type collector layer side, and
a gradient of the carrier concentration in the n-type buffer layer at a connection between the n-type drift layer and the n-type buffer layer is 20 to 2000 cm$^{-4}$.

18. The semiconductor device of claim 17, wherein the effective dose in the n-type buffer layer is $1\times10^{12}$ to $5\times10^{12}$ cm$^{-2}$ higher than that in the n-type drift layer.

19. The semiconductor device of claim 17, further comprising:
an LNFLR (Linearly-Narrowed Field Limiting Ring) structure provided in a terminal region; and
a RESURF (Reduced Surface Field) structure provided in an outer end part of the p-type base layer.

* * * * *